United States Patent
Daubenspeck et al.

(10) Patent No.: US 8,350,383 B2
(45) Date of Patent: Jan. 8, 2013

(54) IC CHIP PACKAGE HAVING IC CHIP WITH OVERHANG AND/OR BGA BLOCKING UNDERFILL MATERIAL FLOW AND RELATED METHODS

(75) Inventors: Timothy H. Daubenspeck, Essex Junction, VT (US); Jeffrey P. Gambino, Essex Junction, VT (US); Christopher D. Muzzy, Essex Junction, VT (US); Wolfgang Sauter, Essex Junction, VT (US); Timothy D. Sullivan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 12/503,870

(22) Filed: Jul. 16, 2009

(65) Prior Publication Data

US 2011/0012249 A1    Jan. 20, 2011

(51) Int. Cl.
*H01L 23/04* (2006.01)
(52) U.S. Cl. ............... 257/730; 257/777; 257/E21.503; 257/E23.069; 438/123
(58) Field of Classification Search ........... 257/E21.503, 257/E23.069, 730
See application file for complete search history.

(56) References Cited

U.S. PATENT DOCUMENTS

| | | | |
|---|---|---|---|
| 5,784,260 A | 7/1998 | Fuller, Jr. et al. | |
| 6,614,122 B1 | 9/2003 | Dory et al. | |
| 7,026,234 B2 | 4/2006 | Jao et al. | |
| 7,112,470 B2 | 9/2006 | Daubenspeck et al. | |
| 7,122,874 B2 | 10/2006 | Kim | |
| 7,368,821 B2 | 5/2008 | Kim et al. | |
| 7,494,900 B2 | 2/2009 | Harris et al. | |
| 2004/0119152 A1* | 6/2004 | Karnezos et al. | 257/686 |
| 2005/0051885 A1* | 3/2005 | Weng et al. | 257/687 |
| 2006/0049522 A1 | 3/2006 | Libres et al. | |
| 2006/0237845 A1 | 10/2006 | Hall et al. | |
| 2007/0289777 A1 | 12/2007 | Pendse | |
| 2008/0242054 A1 | 10/2008 | Antonelli et al. | |

* cited by examiner

*Primary Examiner* — Ajay K Arora
(74) *Attorney, Agent, or Firm* — Richard M. Kotulak; Hoffman Warnick LLC

(57) ABSTRACT

An IC chip package, in one embodiment, may include an IC chip including an upper surface including an overhang extending beyond a sidewall of the IC chip, and underfill material about the sidewall and under the overhang. The overhang prevents underfill material from extending over an upper surface of the IC chip. In another embodiment, a ball grid array (BGA) is first mounted to landing pads on a lower of two joined IC chip packages. Since the BGA is formed on the lower IC chip package first, the BGA acts as a dam for the underfill material thereon. The underfill material extends about the respective IC chip and surrounds a bottom portion of a plurality of solder elements of the BGA and at least a portion of respective landing pads thereof.

19 Claims, 3 Drawing Sheets

IC CHIP PACKAGE HAVING IC CHIP WITH OVERHANG AND/OR BGA BLOCKING UNDERFILL MATERIAL FLOW AND RELATED METHODS

BACKGROUND

1. Technical Field

The disclosure relates generally to integrated circuit (IC) chip packaging, and more particularly, to an IC chip package having an IC chip with an overhang and/or ball grid array (BGA) blocking underfill material flow, and related methods.

2. Background Art

Package-on-package (PoP) is a new three-dimensional integrated circuit (IC) chip packaging technology that allows vertical integration of memory and logic ball grid array (BGA) modules. That is, a memory chip package and a logic chip package are stacked on top of one another to form an integrated package with a standard interface to route signals between them. PoP technology is of particular interest to the mobile market, e.g., for cell phones, personal digital assistants (PDAs), camcorders, etc., because it provides for higher density of circuitry.

One challenge with PoP technology is controlling underfill material flow within the integrated package. Underfill material is designed to flow well to encase controlled collapse chip connectors (C4) under the chip, and typically requires approximately 2.5 millimeter (mm) of space around an IC chip. If such a space is not available (e.g., due to BGA pad locations), the underfill material needs to be stopped by other measures. This issue arises relative to PoP technology when, for example, the bottom package includes a flip chip plastic ball grid array (FC-PBGA). In this situation, as shown in FIG. 1, a top package 10 must be assembled to BGA pads 12 that are on a top surface 14 of a laminate 16 of a bottom package 18. Due to tight space constraints, as shown in left enlarged area in FIG. 1, underfill material 20 oftentimes can flow too far and contaminate, or even cover, BGA pads 12 and prevent joining of top package 10 to bottom package 18. As shown in FIG. 2, one current approach to this problem includes using a dam of ink 22 that is dispensed around IC chip 24 of bottom package 18 to stop underfill material 20 flow. This approach, however, presents a number of disadvantages such as increased cycle time and costs, additional equipment requirements, etc.

Another challenge related to controlling underfill material is maintaining the integrated chip package height very small. In this case, as shown in the right enlarged area in FIG. 1, limiting of underfill material 20 bleed on top of IC chip 24 of bottom package 18 is imperative since there is very limited space (S) between the bottom package's top surface 26 and a bottom surface 28 of top package 10. Currently, it is very difficult to underfill a thin chip while limiting the underfill material bleed on the chip packages' top surface to very small margins.

BRIEF SUMMARY

A first aspect of the disclosure provides an integrated circuit (IC) chip package comprising: a first chip package including: a substrate; an IC chip coupled to the substrate, the IC chip including an upper surface including an overhang extending beyond a sidewall of the IC chip; and underfill material about the sidewall and under the overhang, the overhang preventing underfill material from extending over an upper surface of the IC chip.

A second aspect of the disclosure provides an integrated circuit (IC) chip package comprising: a first IC chip package including: a substrate, a first IC chip coupled to the substrate, a ball grid array (BGA) mounted to landing pads on the substrate and about the first IC chip, and underfill material about the first IC chip and surrounding a bottom portion of a plurality of solder elements of the BGA and surrounding at least a portion of respective landing pads thereof, and a second IC chip package including a second IC chip, the second IC chip package mounted substantially vertically aligned with the first IC chip package, and electrically coupled to the first IC chip package by the BGA.

A third aspect of the disclosure provides a method of creating a first integrated circuit (IC) chip package, the method comprising: dicing an IC chip to include an overhang extending beyond a sidewall of the IC chip; mounting the IC chip to a chip package substrate; and flowing an underfill material about the IC chip, the overhang preventing the underfill material from extending over an upper surface of the IC chip.

A fourth aspect of the disclosure provides a method comprising: providing an upper integrated circuit (IC) chip package and a lower IC chip package to be joined into a package-on-package system in which the upper IC chip package is mounted vertically over the lower IC chip package; creating a ball grid array (BGA) on the lower IC chip package; and joining the upper IC chip package to the lower IC chip package using the BGA.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 3:
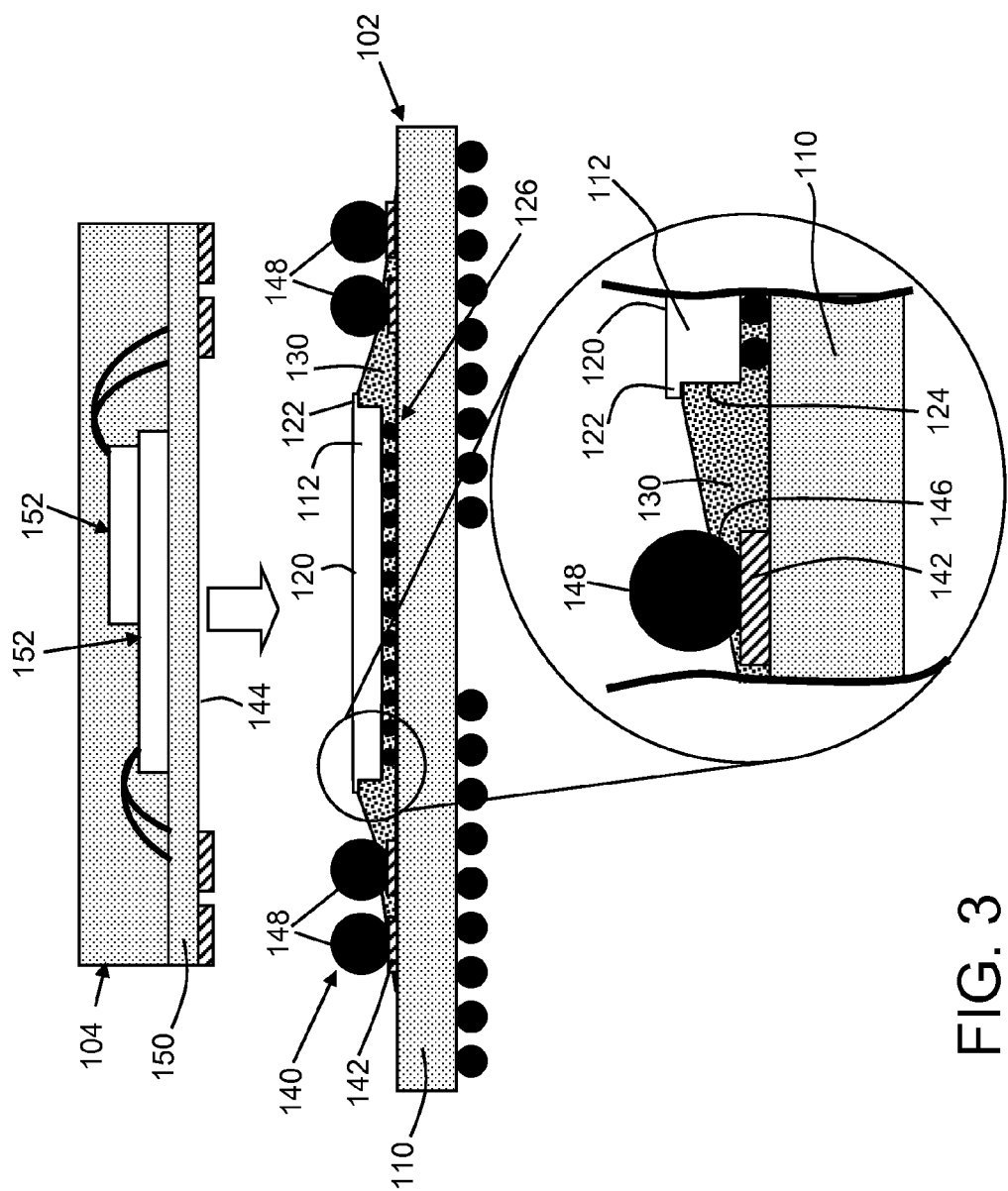
FIG. 3 shows a cross-sectional view of a package-on-package system including an IC chip package according to embodiments of the invention.

Referring to FIG. 3, a cross-sectional view of an integrated circuit (IC) chip package 100 according to embodiments of the invention is illustrated. IC chip package 100 may include a first (lower) chip package 102 and a second (upper) chip package 104, which are shown in an about-to-be assembled position. When packages 102, 104 are combined together, they form a package-on-package (PoP) system. Alternatively, as will be described herein, teachings of the disclosure may be applied to a single chip package, i.e., first chip package 102 as illustrated.

Figure 4:
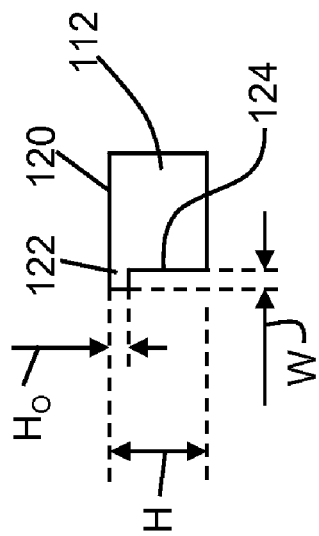
FIG. 4 shows a cross-sectional detailed view of the IC chip in FIG. 3.
Figure 2:
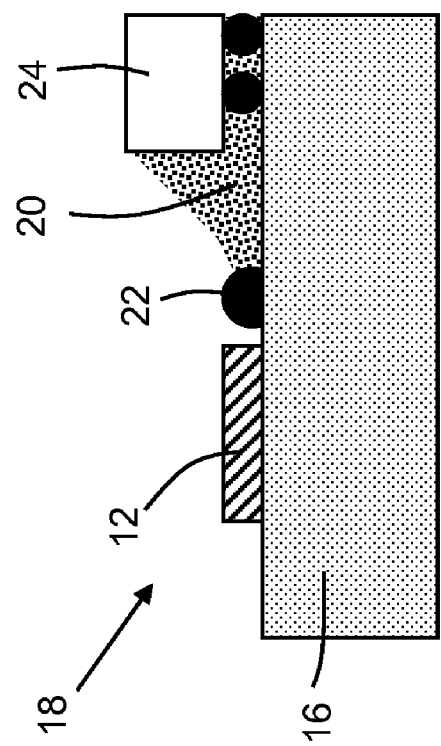
FIG. 2 shows a cross-sectional view of an IC chip package including an ink dam for limiting flow of underfill material according to the prior art.

Referring to FIGS. 3 and 4, one aspect of the invention includes providing an IC chip with an overhang over a sidewall thereof to prevent underfill material from extending over an upper surface thereof. As shown in FIG. 3, first chip package 102 includes a substrate 110 and an IC chip 112 coupled to substrate 110. In one embodiment, IC chip 112 includes a logic chip; however, this is not necessary in all cases. Substrate 110 may include any now known or later developed laminate material, ceramic or other materials typically used for mounting and scaling up an IC chip 112. IC chip 112 includes an upper surface 120 that includes an overhang 122 extending beyond a sidewall 124 of the IC chip. Overhang 122 may be formed during dicing of IC chip 110 from a wafer (not shown) that it is formed within. In this case, the dicing may include making two cuts at different depths, one to form overhang 122 and another to cut IC chip 112 away from the remaining wafer. The two cuts may be made by different blades or a single blade. FIG. 4 shows an enlarged, partial cross-section of IC chip 112 and overhang 122. In one embodiment, a ratio of height (H) of sidewall 124 including overhang 122, i.e., an overall height of IC chip 112, to overhang 122 alone ($H_O$) is no greater than 4:1. That is, overhang 122 is no more than one quarter of the entire height of IC chip 112. It is understood, however, that such a limitation may not be necessary in all cases. A width (W) of overhang 122 may have substantially similar dimensions as its height $H_O$ or may be lengthened to accommodate different underfill materials 130 depending on the available thickness of sidewall 124.

IC chip 112 is mounted to substrate 110 in any now known or later developed fashion, e.g., using a controlled collapse chip connection (C4) 126. An underfill material 130 is then flowed about IC chip 110 in any now known or later developed fashion about sidewall 124 and under overhang 122. In contrast to conventional systems, however, overhang 122 prevents underfill material 130 from extending over upper surface 120 of IC chip 112. In this fashion, the vertical spacing between first chip package 102 and second chip package 104 can be better controlled.

While overhang 122 has been described in the context of a PoP system, it is understood that it may be applied to practically any IC chip regardless of whether in a PoP system or not.

Figure 1:
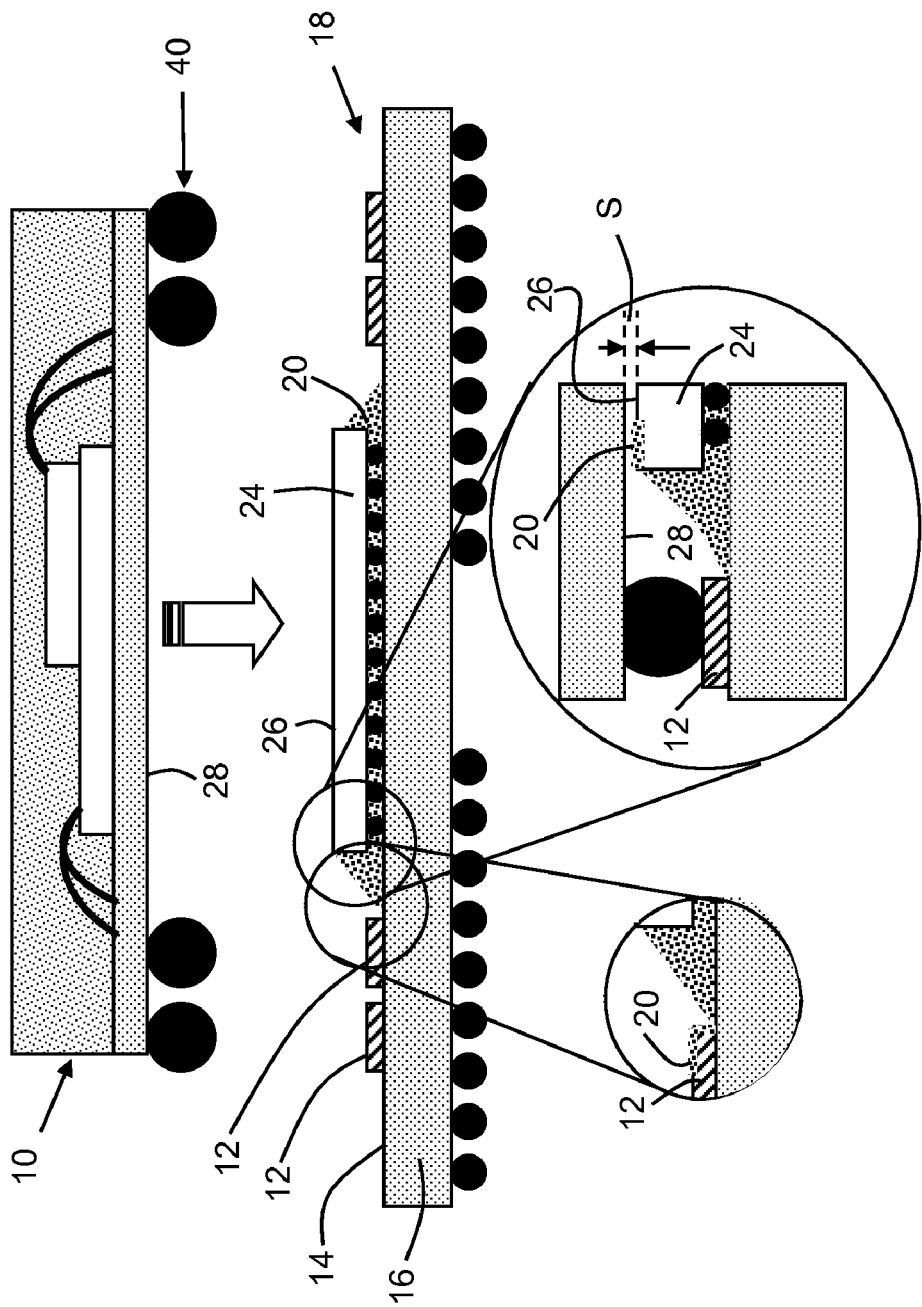
FIG. 1 shows a cross-sectional view of a package-on-package (PoP) system according to the prior art.

In another embodiment, also shown in FIG. 3, in contrast to conventional practice, prior to the flowing of underfill material 130, a ball grid array (BGA) 140 may be (created) mounted to landing pads 142 on substrate 110 and about IC chip 112 in lower IC chip package 102 for a PoP system. In this fashion, underfill material 130 extends about IC chip 112 and surrounds a bottom portion 146 of a plurality of solder elements 148 of BGA 140 and surrounds at least a portion of respective landing pads 142 thereof. That is, a plurality of solder elements 148 of BGA 140 act to dam underfill material 130 during flow thereof and prevent overflow onto landing pads 142 of IC chip package 102. Underflow material 130 acts to support BGA 140. Conventionally, as shown in FIG. 1, a BGA 40 is coupled to a bottom surface 28 of the upper IC chip package 10. Consequently, underfill material 20 may flow over landing pads 12, preventing electrical connection between landing pads 12 and BGA 40.

BGA 140 may include any now known or later developed type of connector array, e.g., a flip chip plastic ball grid array (FC-PBGA), an enhanced plastic ball grid array (EPBGA), a ceramic ball grid array (CBGA), a ceramic column grid array (CCGA), or others including wire bond packages such as gull wing, fine pitch ball grid array (FBGA), chip scale packaging including such products as Tessera® packages, etc. BGA 140 may be created in any known fashion. The type of solder element 148 of BGA 140, although illustrated as solder balls, may take a variety of forms such as a solder column, post, gull wing, lead, etc. BGA 140 may include a lead/tin (Pb/Sn) alloy (or Pb-free such as SnCu, SnAgCu) that aids in reducing the reaction between the copper in landing pads 142 and the tin (Sn). Each landing pad 142 may include a solder wettable pad that acts as an electrical connection between BGA 140 and electrical pathways in substrate 110 and a substrate 150 of second IC chip package 104, respectively. The size of landing pads 142 (and those on upper IC chip package 110) is configured to provide reliable mechanical, electrical and thermal stability.

As shown in FIG. 3, second (upper) IC chip package 104 including a second IC chip 152 is (joined with) mounted substantially vertically aligned with first IC chip package 102, and electrically coupled to first IC chip package 102 by BGA 140. That is, first IC chip package 102 is joined to lower surface 144 of second IC chip package 104 using BGA 140. In one embodiment, IC chip 152 includes a memory chip; however, this is not necessary in all cases.

The above-described embodiments may be employed together or alone.

The methods as described above are used in the fabrication of integrated circuit chip packages. As described above, the methods may be applied to a single chip package (such as an IC chip on a plastic carrier, with leads that are affixed to a motherboard or other higher level carrier) or in a multichip package (such as a ceramic carrier that has either or both surface interconnections or buried interconnections). In any case, the IC chip package may then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) chip package comprising:
   a first chip package including:
      a substrate;

an IC chip coupled to the substrate at a bottom surface of the IC chip, the IC chip including an upper surface opposite the bottom surface and including an overhang extending beyond a sidewall of the IC chip,
wherein the sidewall spans between the bottom surface and the upper surface of the IC chip, and
wherein the overhang extends from the upper surface less than or equal to one quarter of a length of the sidewall; and
underfill material about the sidewall and under the overhang, the overhang preventing the underfill material from extending over an upper surface of the IC chip,
wherein the underfill material contacts substantially an entirety of the sidewall between the upper surface and the bottom surface of the IC chip.

2. The IC chip package of claim 1, further comprising:
a second IC chip package mounted substantially vertically aligned with the first IC chip package, and electrically coupled to the first IC chip package by a ball grid array (BGA).

3. The IC chip package of claim 2, wherein a plurality of solder elements of the BGA dam the underfill material around the IC chip.

4. The IC chip package of claim 2, wherein the underfill material surrounds a bottom portion of a plurality of solder elements of the BGA.

5. The IC chip package of claim 2, wherein the first IC chip package includes a logic chip, and the second IC chip package includes a memory chip.

6. The IC chip package of claim 1, wherein the underfill material surrounds substantially an entirety of a height of the IC chip.

7. The IC chip package of claim 1, wherein the substrate has a planar upper surface coupled to the IC chip.

8. An integrated circuit (IC) chip package comprising:
a first IC chip package including:
  a substrate,
  a first IC chip coupled to the substrate at a bottom surface of the first IC chip, the first IC chip including an upper surface opposite the bottom surface and including an overhang extending beyond a sidewall of the IC chip
  wherein the sidewall spans between the bottom surface and the upper surface of the first IC chip, and
  wherein the overhang extends from the upper surface less than or equal to one quarter of a length of the sidewall;
  a ball grid array (BGA) mounted to landing pads on the substrate and about the first IC chip, and
  underfill material about the first IC chip and surrounding a bottom portion of a plurality of solder elements of the BGA and surrounding at least a portion of respective landing pads thereof,
  wherein the overhang prevents the underfill material from extending over the upper surface of the first IC chip,
  wherein the underfill material contacts substantially an entirety of the sidewall between the upper surface and the bottom surface of the IC chip; and
a second IC chip package including a second IC chip, the second IC chip package mounted substantially vertically aligned with the first IC chip package, and electrically coupled to the first IC chip package by the BGA.

9. The IC chip package of claim 8, wherein the first IC chip package includes a logic chip, and the second IC chip package includes a memory chip.

10. The IC chip package of claim 8, wherein the underfill material surrounds substantially an entirety of a height of the first IC chip.

11. The IC chip package of claim 8, wherein the substrate has a planar upper surface coupled to the first IC chip.

12. A method of creating a first integrated circuit (IC) chip package, the method comprising:
dicing an IC chip to include an overhang extending beyond a sidewall of the IC chip,
wherein the sidewall spans between a bottom surface and an upper surface of the IC chip, and
wherein the dicing results in the overhang extending from the upper surface less than or equal to one quarter of a length of the sidewall;
mounting the bottom surface of the IC chip to a chip package substrate; and
flowing an underfill material about the IC chip to contact substantially an entirety of the sidewall between the upper surface and the bottom surface of the IC chip, the overhang preventing the underfill material from extending over the upper surface of the IC chip.

13. The method of claim 12, further comprising creating a ball grid array (BGA) on the first IC chip package substrate about the IC chip prior to the flowing of the underfill material about the IC chip.

14. The method of claim 13, further comprising joining the first IC chip package to a lower surface of a second IC chip package using the BGA.

15. The method of claim 14, wherein the first IC chip package includes a logic chip, and the second IC chip package includes a memory chip.

16. The method of claim 13, wherein a plurality of solder elements of the BGA dam the underfill material around the IC chip during the flowing of the underfill material about the IC chip.

17. A method comprising:
providing an upper integrated circuit (IC) chip package and a lower IC chip package to be joined into a package-on-package system in which the upper IC chip package is mounted vertically over the lower IC chip package,
the lower IC chip package providing including:
  dicing an IC chip of the lower IC chip package to include an overhang extending beyond a sidewall of the IC chip,
  wherein the sidewall spans between a bottom surface and an upper surface of the IC chip, and
  wherein the dicing results in the overhang extending from the upper surface less than or equal to one quarter of a length of the sidewall;
  mounting the IC chip to a substrate; and
  flowing an underfill material about the IC chip to contact substantially an entirety of the sidewall between the upper surface and the bottom surface of the IC chip;
creating a ball grid array (BGA) on the lower IC chip package; and
joining the upper IC chip package to the lower IC chip package using the BGA.

18. The method of claim 17, wherein the upper IC chip package providing includes flowing the underfill material about the IC chip of the lower IC chip package, a plurality of solder elements of the BGA damming the underfill material around the IC chip.

19. The method of claim 17, wherein the upper IC chip package includes a memory chip, and the lower IC chip package includes a logic chip.

* * * * *